United States Patent
Lin et al.

(10) Patent No.: US 8,034,722 B2
(45) Date of Patent: Oct. 11, 2011

(54) METHOD OF FORMING DUAL DAMASCENE SEMICONDUCTOR DEVICE

(75) Inventors: Chih-Han Lin, Tainan (TW); Kun-Ei Chen, Beiman Township, Tainan County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 226 days.

(21) Appl. No.: 11/279,055

(22) Filed: Apr. 7, 2006

(65) Prior Publication Data

US 2007/0238306 A1    Oct. 11, 2007

(51) Int. Cl.
*H01L 21/302*    (2006.01)
*H01L 21/461*    (2006.01)

(52) U.S. Cl. .................. 438/736; 438/738; 257/E21.579

(58) Field of Classification Search .................. 438/622, 438/98, 738, 736; 216/72; 257/E21.578
See application file for complete search history.

(56) References Cited

U.S. PATENT DOCUMENTS

| | | | |
|---|---|---|---|
| 5,395,769 A * | 3/1995 | Arienzo et al. | 438/8 |
| 6,103,456 A * | 8/2000 | Tobben et al. | 430/317 |
| 6,211,061 B1 * | 4/2001 | Chen et al. | 438/622 |
| 6,319,824 B1 * | 11/2001 | Lee et al. | 438/639 |
| 6,831,366 B2 | 12/2004 | Gates et al. | |
| 2005/0245074 A1 | 11/2005 | Jiang et al. | |
| 2005/0272265 A1 * | 12/2005 | Geffken et al. | 438/706 |

OTHER PUBLICATIONS

Cronin, J.E. et al.; "Method to Control Depth of Etching"; Aug. 1, 1992; IBM Tech. Disc. Bull.; vol. 35, No. 3; pp. 29-30.*
Cronin, J.E. and Kaanta, C.; 1992; IBM Tech. Disc. Bull.; vol. 35, No. 3; pp. 29-30.*
Wolf, S.; "Microchip Manufacturing"; 2004; Lattice Press; pp. 449-453.*
J.E. Cronin and C. Kaanta. Method To Control Depth Of Etching. IBM Technical Disclosure Bulletin, vol. 35, No. 3, Aug. 1, 1992, pp. 29-30; electronic publication Mar. 23, 2005. USA.

* cited by examiner

*Primary Examiner* — Stephen W Smoot
*Assistant Examiner* — Vicki B Booker
(74) *Attorney, Agent, or Firm* — Duane Morris LLP

(57) ABSTRACT

A method of forming a dual damascene includes forming first, second and third material layers sequentially over a substrate. The first, second and third material layers have first, second and third thicknesses, respectively. An opening is etched within the first material layer while a portion or all of the thickness of the third layer is simultaneously removed. The ratio of the depth of the opening and the thickness of the third material layer removed, correspond to an etch selectivity of the first material layer and the second material layer. The etching operation may be automatically terminated to produce the opening with a predetermined depth.

13 Claims, 7 Drawing Sheets

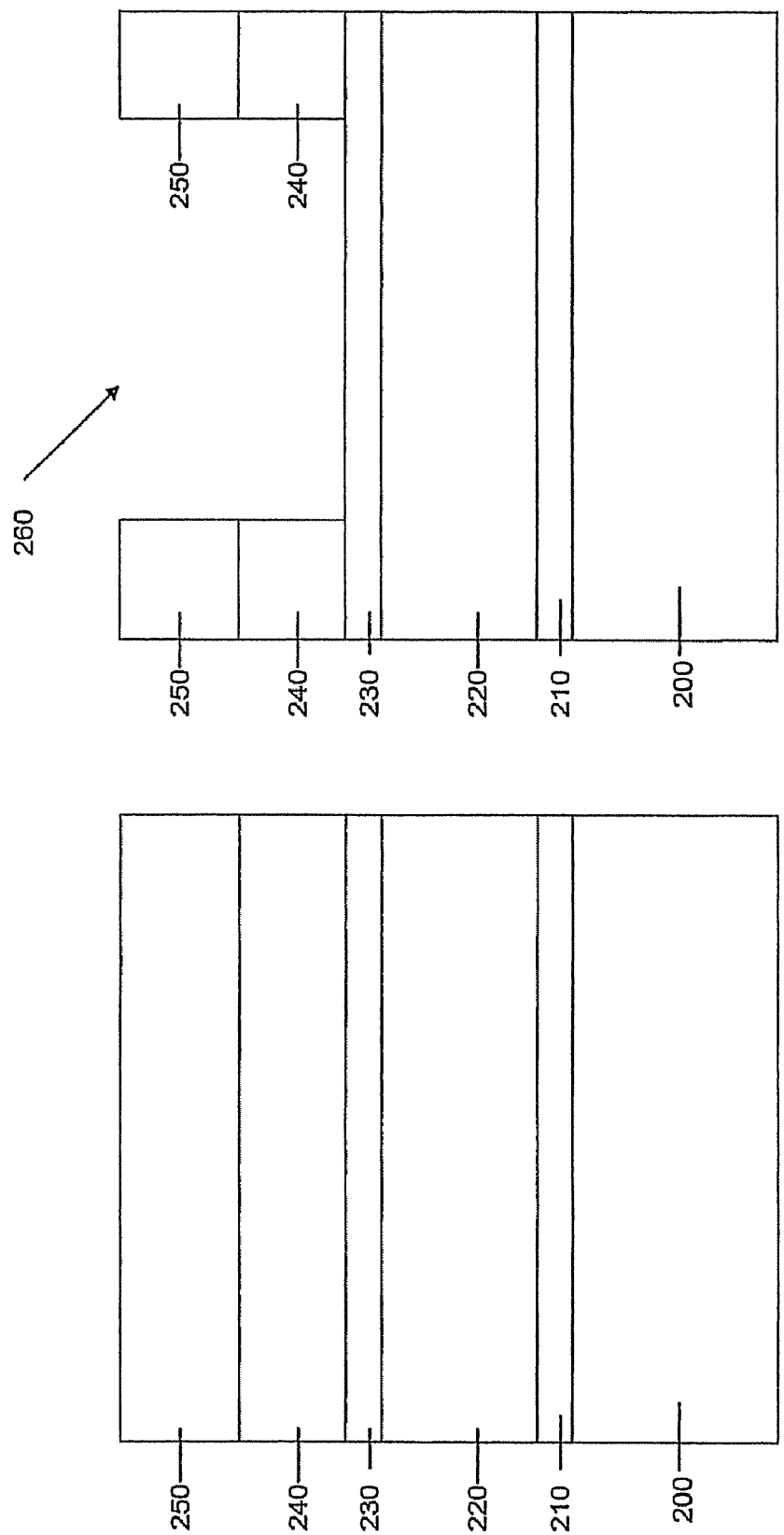

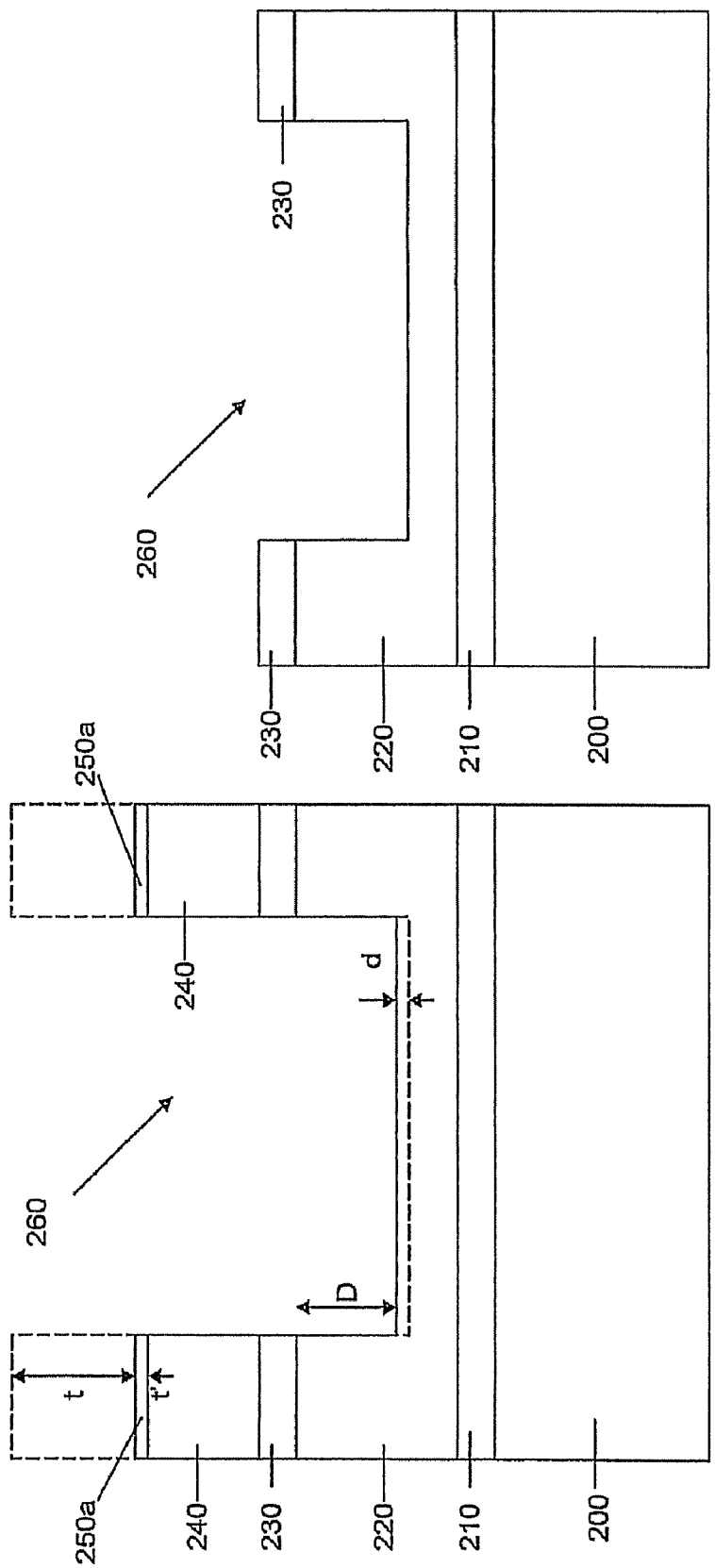

US 8,034,722 B2

METHOD OF FORMING DUAL DAMASCENE SEMICONDUCTOR DEVICE

BACKGROUND OF THE INVENTION

1. Field of the Invention

The present invention relates to methods of forming dual damascene openings in which interconnect leads of semiconductor devices are formed.

2. Description of the Related Art

With advances of electronic products, semiconductor technology has been widely applied in manufacturing memories, central processing units (CPUs), liquid crystal displays (LCDs), light emission diodes (LEDs), laser diodes and other devices or chip sets. In order to achieve high-integration and high-speed requirements, dimensions of semiconductor integrated circuits have been reduced and various materials and techniques have been proposed and used to achieve these requirements and overcome obstacles during manufacturing. For example, dual damascene technology and copper are applied to reduce resistances and resistance-capacitance (RC) delay of interconnect structures in integrated circuits. Low-k (low dielectric constant) dielectric materials are required in advanced copper interconnect technology.

FIGS. 1A-1D are schematic cross-sectional views of a prior art method of forming a dual damascene, opening shown step-by-step.

In FIG. 1A, a multi-layer structure is formed. The multi-layer structure includes a silicon nitride layer 110, an oxide layer 120, a nitride layer 130, an oxide layer 140, a silicon oxy-nitride layer 150 and a photoresist layer 160 which are sequentially formed on a substrate 100.

In FIG. 1B, the photoresist layer 160 is patterned to form a trench photoresist opening 170 by a photolithographic process. The oxy-nitride layer is a barrier layer to prevent the photoresist layer 160 from contacting the oxide layer 140, which is a low-k dielectric material layer.

In FIG. 1C, the oxide layer 140 and silicon oxy-nitride layer 150 are patterned to form a trench opening 170a by an etch process with the trench photoresist pattern shown in FIG. 1B. In this etch process, the nitride layer 130 is an etch-stop layer necessary to prevent the oxide layer 120 thereunder from being damaged or etched.

In FIG. 1D, a via hole 180 is formed within the nitride layer 130, the oxide layer 120 and the silicon nitride layer 110. The combination of the trench opening 170a and the via hole 180 provides a dual damascene opening. In this method, the high-k material layers including the silicon oxy-nitride layer 150, the nitride layer 130 and the silicon nitride layer 110 undesirably enhance the capacitances of the interconnect structure. They also raise manufacturing costs of the interconnect structure. It would be desirable to avoid the use of layers with high dielectric constants.

U.S. Pat. No. 6,831,366 provides a low-k dielectric metal conductor interconnect structure. The structure includes at least a multilayer of dielectric materials which are applied sequentially in a single spin apply tool and then cured in a single step and a plurality of patterned metal conductors within the multilayer of spun-on dielectrics. The control over the conductor resistance is obtained by using a buried etch stop layer having a second atomic composition located between the line and via dielectric layers of porous low-k dielectrics having a first atomic composition. The interconnect structure also includes a hard mask which assists in forming the interconnect structure of the dual damascene. The first and second composition are selected to obtain etch selectivity of at least 10 to 1 or higher, and are selected from specific groups of porous low-k organic or inorganic materials with specific atomic compositions and other discoverable quantities.

U.S. Patent Publication No. 2005/0245074 provides a single or dual damascene interconnect structure in the fabrication of semiconductor devices. A via for the interconnect structure is formed by etching an ILD and etch-stop layers in-situ without performing an ashing act therebetween. Then, a patterned resist is ashed in-situ after the resist has been employed in forming the via.

Improved methods of forming a dual-damascene structure are desired. In particular, it would be desirable to etch a trench to a pre-determined stopping point without having to add additional etch stop layers that are undesirable high-k dielectrics.

SUMMARY OF THE INVENTION

In accordance with one aspect of the invention, a method comprises forming first, second and third material layers sequentially over a substrate, the first, second and third material layers having first, second and third thicknesses, respectively; and patterning an opening extending by a depth into the first material layer while removing a removed thickness of the third material layer, using an etching process. The ratio of depth to the removed thickness corresponds to an etch selectivity of the first material layer to the third material layer in the etching process used for etching.

In accordance with another aspect of the invention, a method for forming an opening in a material layer comprises providing a substrate with an upper material layer thereon, forming first, second and third material layers sequentially over the upper material layer, the first, second and third material layers having first, second and third thicknesses, respectively. The method further provides for using an etch process to etch to form a downwardly extending opening in the first material layer and which does not extend below the first material layer, while simultaneously completely removing the third material layer.

The above and other features of the present invention will be better understood from the following detailed description of the preferred embodiments of the invention that is provided in connection with the accompanying drawings.

BRIEF DESCRIPTION OF THE DRAWINGS

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIGS. 2A-2G are schematic cross-sectional views of an exemplary method of forming a dual damascene, shown step-by-step.

DESCRIPTION OF THE PREFERRED EMBODIMENT

Figure 1B:
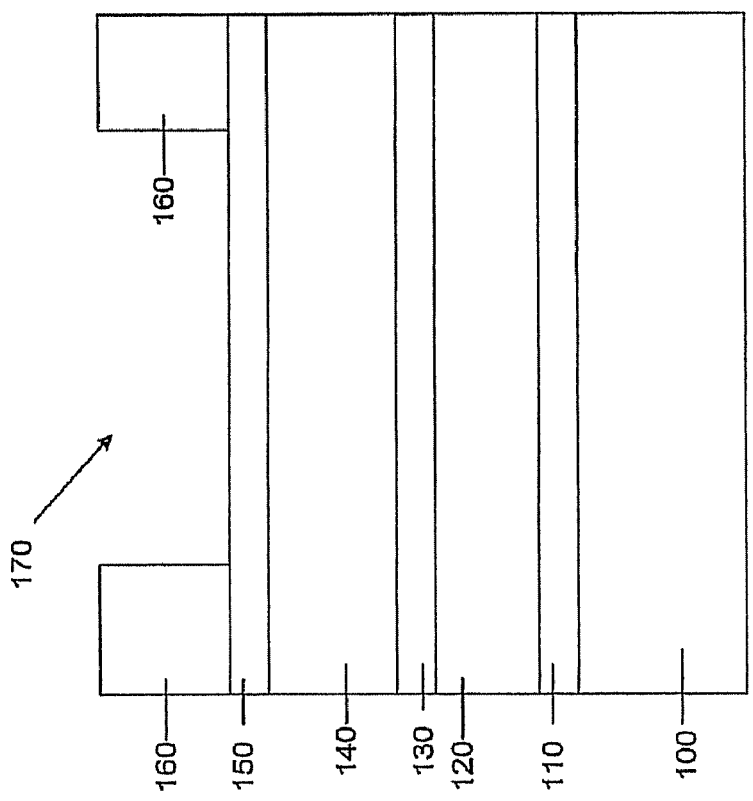
FIGS. 1A-1D are schematic cross-sectional views of a prior art method of forming a dual damascene, shown step-by-step.
Figure 1A:
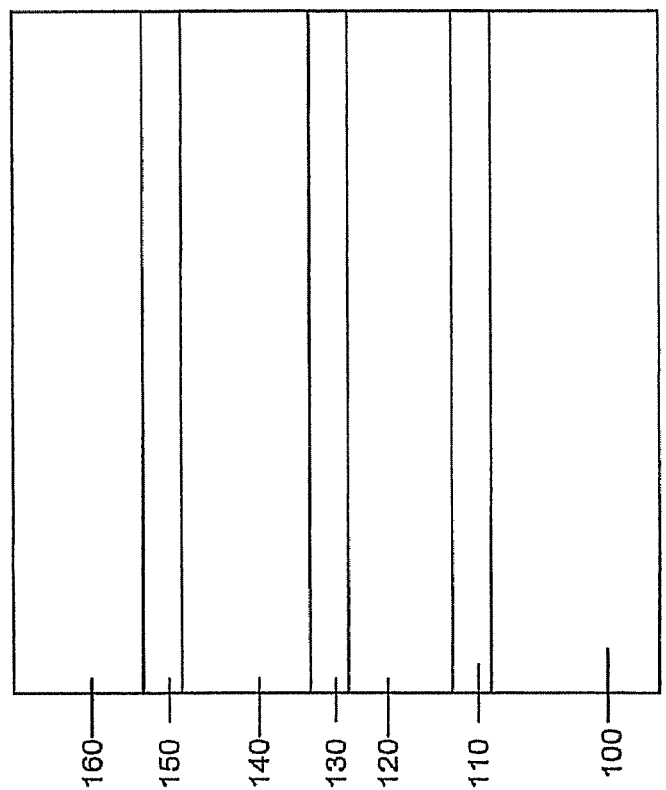
Figure 1D:
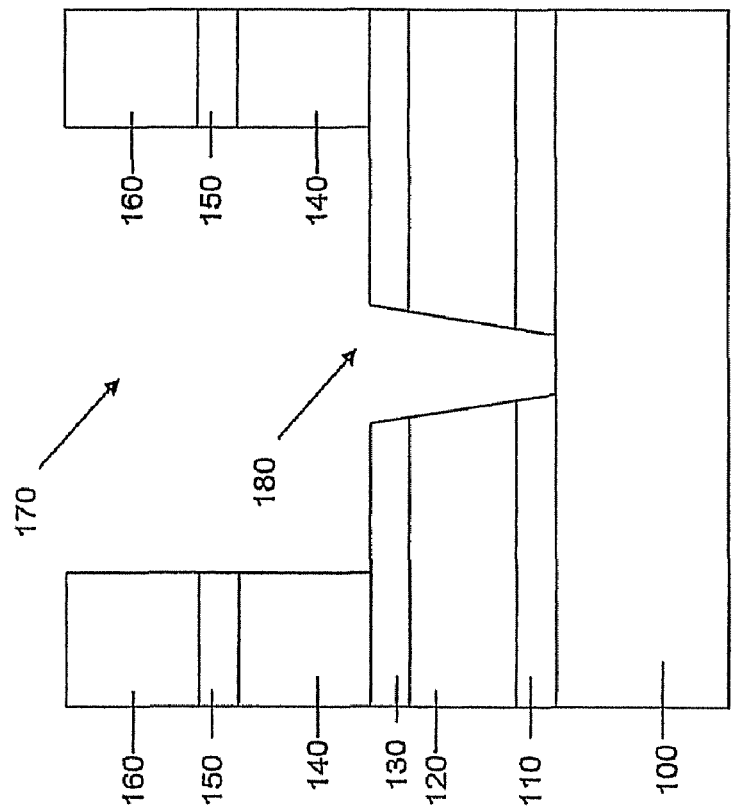
Figure 1C:
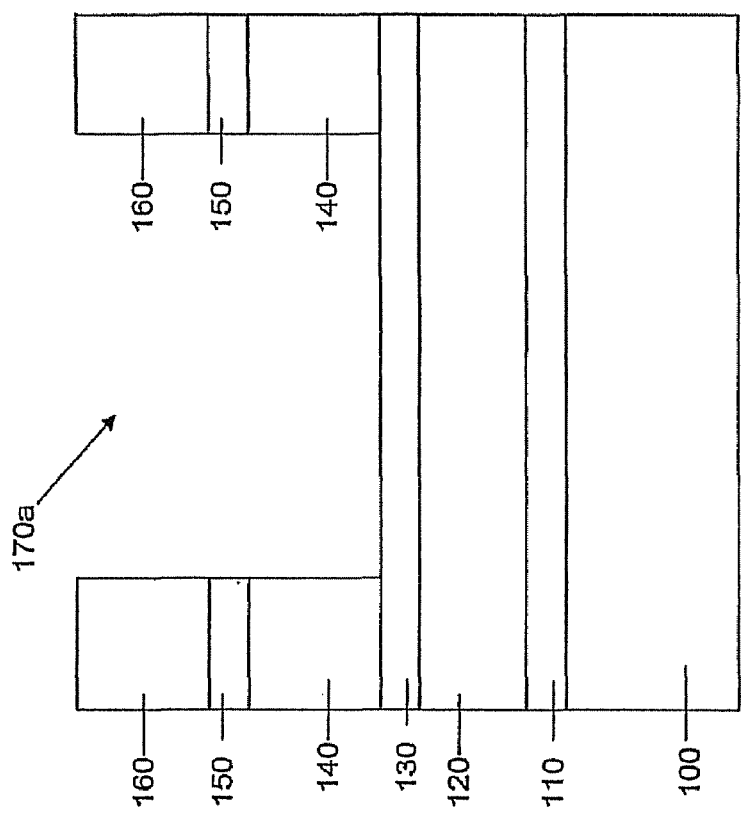

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the structure be constructed in a particular orientation.

FIGS. 2A-2D are schematic cross-sectional views of an exemplary method of forming a dual damascene opening, shown step-by-step.

In FIG. 2A, the first to fifth material layers 210-230 are sequentially formed over a substrate 200. The substrate 200 can be, for example, a silicon substrate, a III-V compound substrate, a glass substrate, a printed circuit board (PCB) or any other substrate similar thereto. In addition, the substrate 200 may comprise various devices or circuits thereon to provide desired electrical operations.

The material layers 210-230 can be, for example, oxide, nitride, oxy-nitride, low-k dielectric material, photoresist or other material in which the adjacent material layers have material characteristics different than one another. The material layers 210-230 can be formed by chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer over the substrate 200.

In some embodiments, the material layer 210 comprises a dielectric layer, such as oxide, nitride, oxy-nitride, low-k dielectric material or other dielectric material. The thicknesses of the material layers 210-250 vary with the applied technology. For example, the thickness of the material layer 210 can be from about 400 Å to about 700 Å when formed by CVD for 90-nm or 65-nm technology. In one embodiment, the material layer 210 comprises a silicon nitride layer and the thickness of the material layer 210 is about 550 Å.

In some embodiments, the material layer 220 comprises a dielectric layer, such as oxide, nitride, oxy-nitride, low-k dielectric material or other dielectric material. In the example of 90-nm or 65-nm technology, the thickness of the material layer 220 can be formed to be from about 5000 Å to about 7000 Å by CVD or spin-coating. In one embodiment, the material layer 220 comprises a low-k dielectric material layer such as an inorganic oxide film. Hydrogen silsesquioxane, methyl silsesquioxane, back diamond, fluorinated silica glass; phosphosilicate glass, or other materials may be used in exemplary embodiments. In other exemplary embodiments, material layer 220 may be an organic oxide film such as poly-tetrafluoroethylene, benzocyclobutene, poly-tetra-fluoro-ethylene and the like. Dopant atoms such as F, H, or P, may optionally be added to the oxide or other material to alter the material. Such dopants would reduce the polarizability to provide lower k value. In some embodiments, the optional material layer 230 comprises a dielectric layer, such as oxide, nitride, oxy-nitride, low-k dielectric material or other dielectric material. In the exemplary 90-nm or 65-nm technology, the thickness of the material layer 230 can be formed to be from about 600 Å to about 1000 Å by CVD. In one embodiment, the material layer 230 comprises a silicon oxy-nitride layer and the thickness of the material layer 230 may be about 700 Å.

In some embodiments, the material layer 240 comprises a layer of photoresist or other photo-sensitive material. In the exemplary 90-nm or 65-nm technology, the thickness of the material layer 240 can be formed to be from about 3000 Å to about 7000 Å by a spin-coating method. Material layer 240 may be 153 nm, 193 nm, 248 nm, I line or DUV photoresist or other common photoresists, e.g., TS, SEPR, TOK, TDUR, TS, ARX, HMD, etc. The thickness of the material layer 240 may about 5000 Å in one embodiment, but other thicknesses may be used in other embodiments.

Material layer 250 is formed of a different material than material layer 240. In some embodiments, the material layer 250 comprises a further photoresist layer. Both material layers 240 and 250 may be formed of positive photoresists in various embodiments. In the exemplary 90-nm or 65-nm technology, the thickness of the material layer 250 can be formed to be from about 1000 Å to about 6000 Å by a spin-coating method. In various exemplary embodiments, the material layer 250 may be a photoresist layer such as 153 nm, 193 nm, 248 nm, I line or DUV photoresist or other common photoresists (e.g., TS, SEPR, TOK, TUDR, TS, ARX, HMD. etc . . . ) and the thickness of the material layer 250 may be about 5000 Å. Material layer 250 may be a TARC (top anti-reflective coating) or other anti-reflective coating (ARC). Material layer 250 advantageously differs from material layer 240.

As set forth above, the thicknesses of the material layers 210-250 vary with the applied technology. For example, the thicknesses of the material layers 210-250 can be reduced, if dimensions of devices have been reduced. One skilled in the art can readily select different materials and thicknesses to form a desired dual damascene. The material layers 240 and 250 have at least one material characteristic that differs in the two materials.

In FIG. 2B, an opening 260, i.e., a trench, is formed within the material layers 240 and 250. The opening 260 can be formed by an etch, photolithographic (e.g., exposing and developing) or other process that is adapted to remove a portion of the material layers 240 and 250 and expose the underlying layer which is material layer 230 in the illustrated embodiment. In some embodiments in which the material layers 240 and 250 are photoresist layers, the opening 260 can be formed by subjecting the material layers 240 and 250 to an exposing and developing processes. In some embodiments, the material layer 230 is a barrier layer for a subsequent copper deposition (not shown). In other embodiments, material layer 230 is not used and material layer 240 is formed on the material layer 220 in which a dual damascene opening is to be formed. According to that embodiment, opening 260 exposes a section of material layer 220.

Figure 2D:
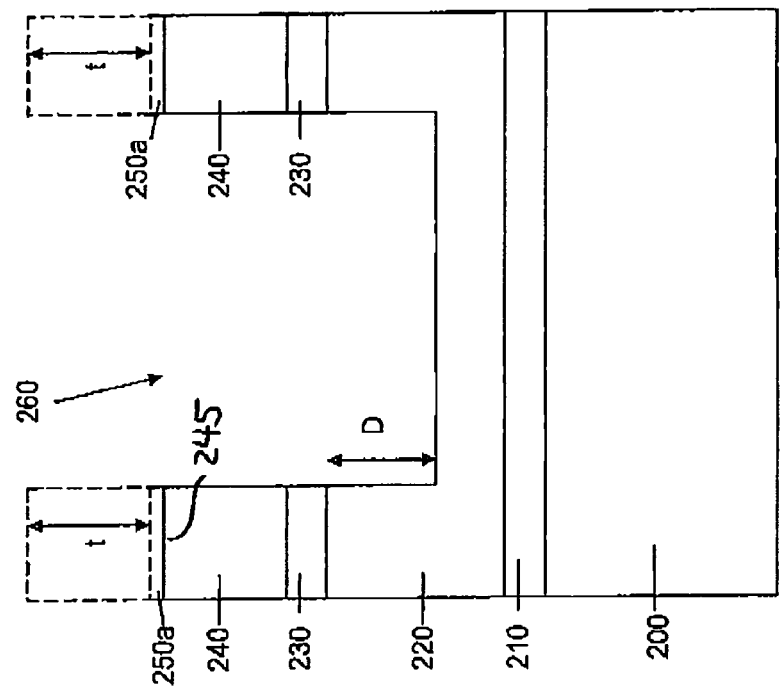
Figure 2C:
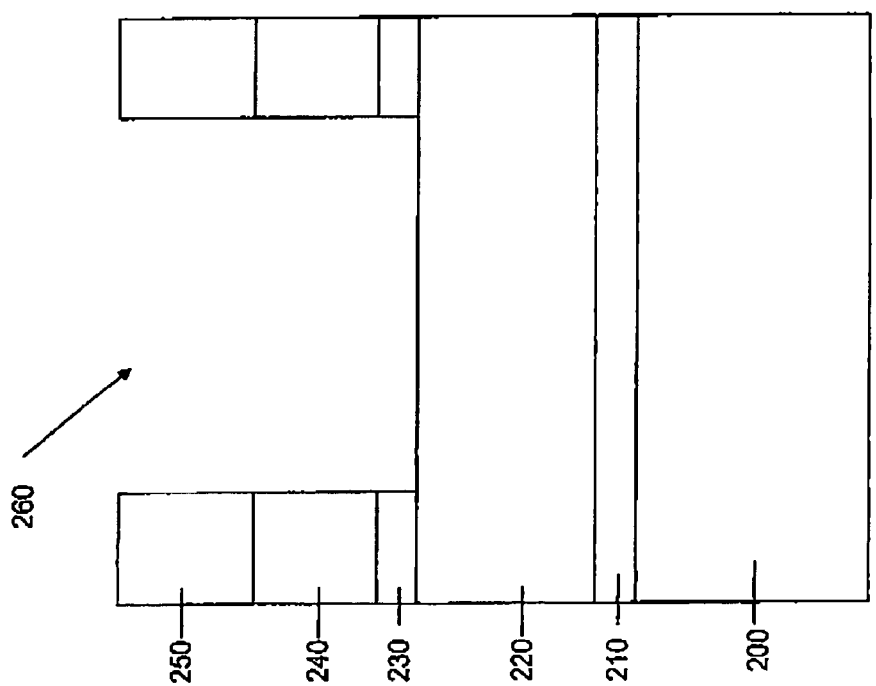

In FIG. 2C, a portion of the material layer 230 is removed to expose a top surface of the material layer 220. The process to remove the portion of the material layer 230 can be, for example, an etch, photolithographic (e.g., exposing and developing) or other process that is adapted to remove the portion of the material layer 230. In some embodiments, the material layer 230 comprises a silicon oxy-nitride layer and can be removed by a halogen-base etch gas, such as $CF_4$, $CHF_3$, $CH_2F_2$ or $NF_3$.

In FIG. 2D, a portion of the material layer 220 is removed to a depth D while a portion of thickness t of the material layer 250 is simultaneously removed during an etching process leaving unremoved portion 250a of material layer 250. The ratio of depth D to removed thickness t corresponds to an etch selectivity of the material in material layer 220 to the material of material layer 250. In some embodiments, the etch selectivity of the material layer 250 to the material layer 220 is from about 0.5 to 1.5. Conventional etch recipes suitable to the material (material layer 220) being etched, may be used. For example, $O_2$ may be used to etch photoresist Ar and $CF_4$ gas may be used to etch oxides, etc. The etch process is selected to provide the desired etch selectivity and resulting thickness correlations. In some embodiments, the depth D is about 40% to about 60% of the thickness of the material layer 220 and will be a predetermined depth. For 90-nm or 65-nm technology, the depth D may be about 3200 Å. As set forth above, the dimensions of the depth D and the thickness of the material layer 220 vary with the applied technology. For example, if the thickness of the material layer 220 is reduced, the depth D within the material layer 220 may also be reduced. In an advantageous embodiment, depth D is less than the thickness of material layer 220. In an advantageous embodiment as illustrated in FIG. 2D, depth D is less than the original thickness of material layer 220 and t is less than the original thickness of material layer 250. According to this illustrated embodiment. on etch stop layer is not utilized to stop the etch process.

In other exemplary embodiments, the entire thickness of material layer 250 is substantially removed to expose a top surface 245 of the material layer 240. In an advantageous embodiment, the total thickness of material layer 250 is chosen in conjunction with the etch process such that material layer 250 is completely removed to produce desired depth D of opening 260 extending not deeper than the thickness of material layer 220. An automatic endpointing system may be used to terminate the etch when the material layer 250 is completely removed. A signal corresponding to at least one material characteristic of the material layer 250 may be detected by the endpointing system. The material characteristic may comprise a CN, CO, CF or other signal in one exemplary embodiment. This characteristic can be formed by adding dopants that can be shown in a spectrum.

In some embodiments, after the signal corresponding to the material characteristic is detected, the etch process applied to simultaneously etch the material layers 220 and 250 can be either automatically stopped or reduced by applying another etch process that reduces etch rates to the material layers 220 and 250, when the signal changes, drops, or otherwise inflects according to conventional endpointing techniques that thereby indicates that all of material layer 250 has been removed.

The endpointing technique used to automatically terminate the etch when the material layered 250 is completely removed, relies upon differences between the characteristics of material layers 240 and 250. In some exemplary embodiments, as above, dopants may be added to provide different characteristics to the materials. In other exemplary embodiments, a series of different photoresist materials may be used.

Figure 2G:
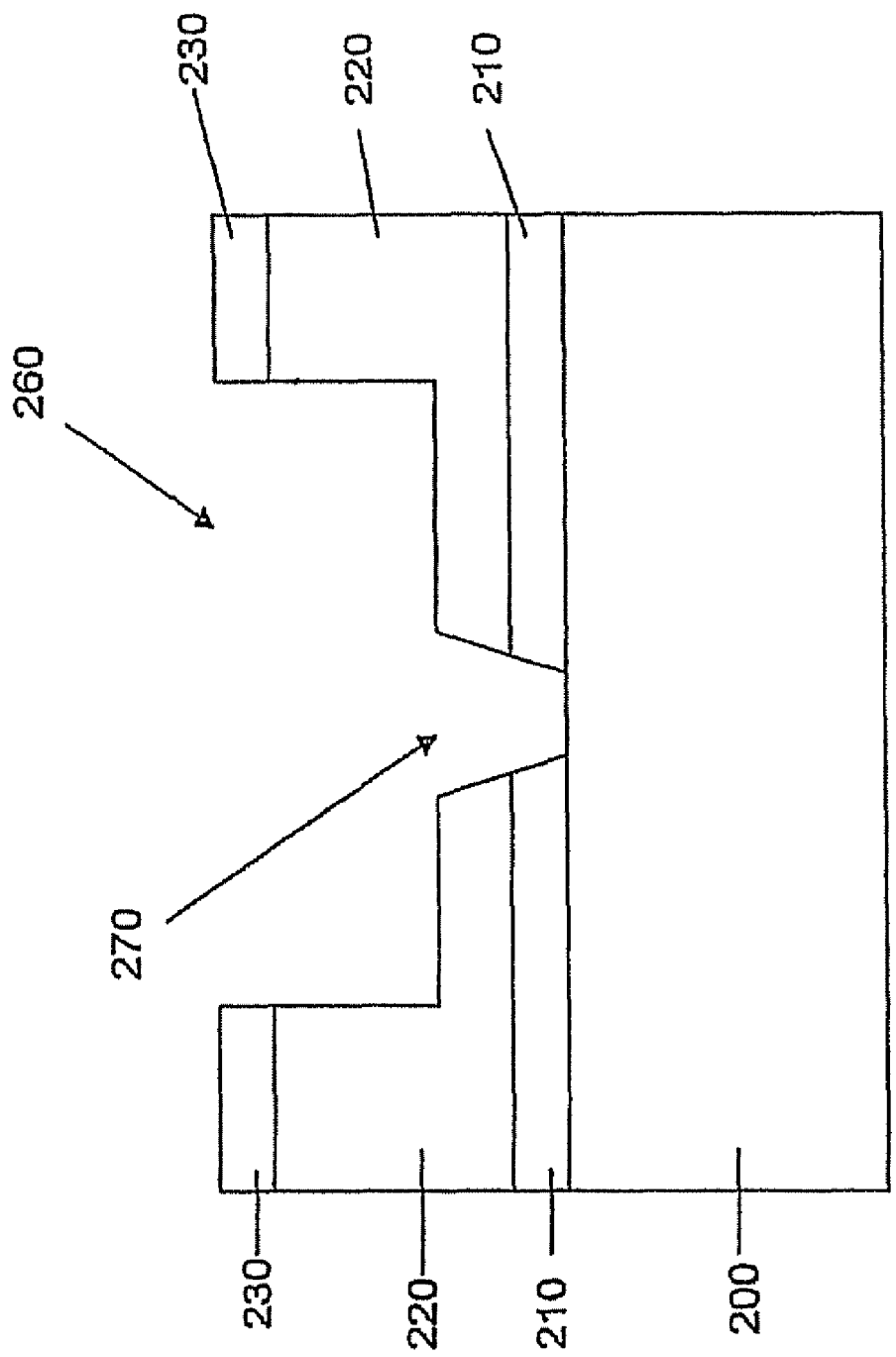
Figure 3A:
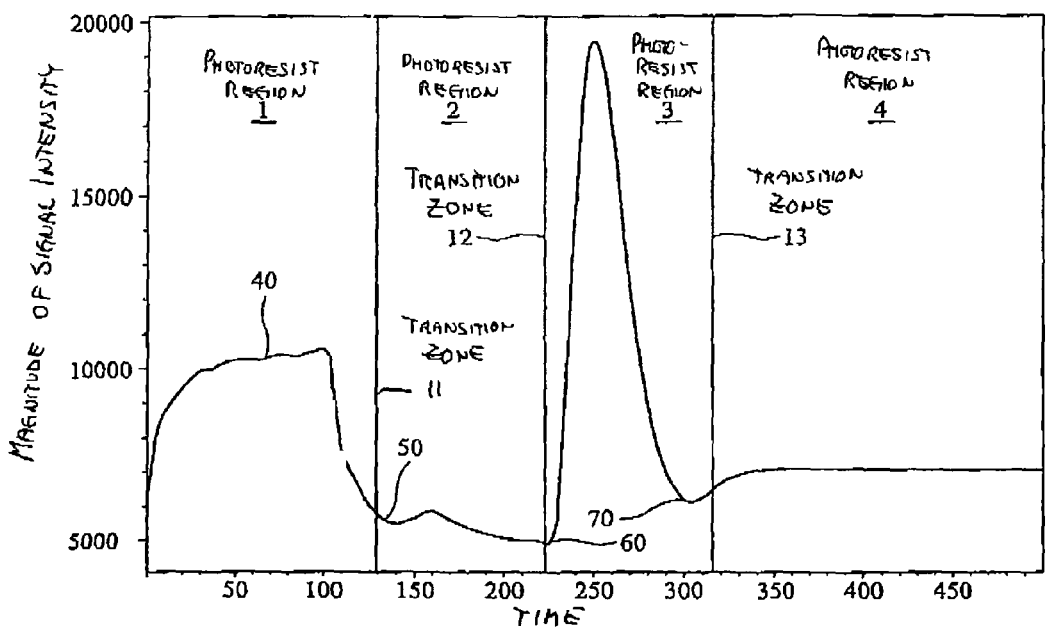
FIG. 3A shows signal intensities of various photoresist materials within a spectrum range from about 385 nm to about 390 nm.

FIG. 3A shows signal intensities of various photoresist materials within a spectrum range of about 385 nm to about 390 nm. The intensity of signal 40 is shown as a function of time, as an etching procedure successively removes different photoresist materials represented by regions 1, 2, 3 and 4. It can be seen that there are inflection points 50, 60 and 70 at or near the transition zones 11, 12, and 13 between the different photoresist materials represented by regions 1, 2, 3 and 4. As such, referring to FIGS. 2A-2G, material layers 240 and 250 may simply be formed of different photoresist materials, i.e., photoresist materials having a characteristic that is detectable within a certain wavelength range and which provides a signal that changes or inflects when one photoresist material is completely removed, i.e., when the interface between the two different photoresist materials is reached. In other exemplary embodiments, the material layers 240 and 250 may represent other different materials and signals representative of various film qualities may be similarly used to detect when the material layer 250 is completely removed and material layer 240 exposed.

According to the aforementioned technique, depth D may be pre-selected based on thickness t and the etch selectivity.

In other embodiments, a major portion but not the entire thickness of layer 250 is may be removed.

In other exemplary embodiments, the pattern shown in FIG. 2D can be formed by a timed etch process, i.e., the removed thickness t is controlled by etch time. For example, the removed thickness t of the material layer 250 and the depth D are substantially equal to the etch time T multiplied by the etch rates of the material layers 250 and 220, respectively, and etch time T can therefore be pre-selected to provide predetermined depth D. Then, the same or modified recipe is applied to remove the remaining thickness t' of the material layer 250 and an additional depth d corresponding to the remaining thickness t' of the material layer 250 as shown in FIG. 2E. If another recipe is used, the selectivity between the material layer 220 and material layer 250, and therefore the relative amounts of depth d and thickness t', may differ from the recipe first used. As the description set forth above, one skilled in the art can readily select a desired etch method with end-point detection or time mode detection to form the trench opening 260.

In FIG. 2F, the material layer 240 is removed. The process to remove the material layer 240 may comprise a dry etch, wet etch, chemical mechanical polish (CMP), photoresist removal or other process that is able to remove the material layer 240. In some embodiments, the material layer 240 is a photoresist layer and can be removed by a dry etch, i.e., ashing process using oxygen as a reaction gas or a wet etch process using $H_2SO_4$ and $H_2O_2$ as a reaction solution. The selective removal process of material layer 240 does not further etch material layer 220.

In FIG. 2G, another opening 270, i.e., a via hole, is formed within the remaining material layer 220 and, in the illustrated embodiment, extends into and through the material layer 210. The process of forming the opening 270 can be formed by a sequential via photolithographic, via etch, and via photoresist removing process (not shown). Accordingly, a dual damascene opening is formed.

A barrier layer and a copper layer (not shown) can be subsequently formed within the damascene to form interlayer connection. FIGS. 2A-2G show the steps of forming a "trench-first" dual damascene. However, FIGS. 2A-2G merely show an exemplary method of forming a dual damascene. These steps set forth above can also be used to form a "via-first" dual damascene. For example, the opening 270 can be formed prior to steps of forming the opening 260 as shown in FIGS. 2A-2F. A plug (not shown) is then partially or completely filled within the opening 270 to prevent the opening 270 from being subjected to steps shown in FIGS. 2A-2F. Steps shown in FIGS. 2A-2F are then performed to the multilayer structure with the opening 270 to form a trench with a bottom within material layer 220. Based on the description set forth above, one skilled in the art can readily modify the process steps to constitute a desired dual damascene structure.

In other non dual damascene embodiments, the steps set forth above can be used to form a via or contact hole. For example, the depth D formed within the material layer 220 may be chosen to be substantially equal to the thickness of the material layer 220 so that the opening 220 reaches the top surface of the material layer 210 or other material layer, such as a polysilicon, metal or barrier layer (not shown). For these embodiments, the opening 260 can be a via or contact hole, and subsequent steps to form the opening 270 can thus eliminated.

In some embodiments, at least one of the material layers 210, 230 and 240 is not required. For example, the material layer 210 can be eliminated if the material layer 220 does not interfere operations of devices and circuits (not shown) formed on the top surface of the substrate 200, is not subject to the out-diffusion of dopants from devices and circuits (not shown) on the substrate 200 or does not deteriorate the integrate performance of the dual damascene. In some embodiments, the material layer 230 is eliminated if the material layer 220 does not interfere the formation of the subsequent barrier layer and copper layer (not shown). In some embodiment, the material layer 240 is eliminated if the material layer 230 has the same function as an end-point detection layer provided by the material layer 240. One skilled in the art can readily select the material layers to form a desired via or contact hole or dual damascene based on the description set forth above.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method for forming an opening in a composite structure of material layers, comprising:
    forming a composite structure that does not include an etch stop layer by forming first, second and third material layers sequentially over a substrate, said first, second and third material layers having first, second and third thicknesses, respectively, said third material layer being an uppermost, exposed layer; and
    patterning to form an opening extending by a depth into said first material layer while removing a removed thickness of said third material layer using an etch process, a ratio of said depth to said removed thickness substantially corresponding to an etch selectivity of said first material layer to said third material layer in said etch process,
    terminating said etch process based on said removed thickness and without use of an etch stop layer to produce said opening with said depth and having a lowermost bottom surface consisting completely of said first material, said depth being predetermined based upon said removed thickness.

2. The method as in claim 1, wherein said removed thickness of said third material layer is less than said third thickness.

3. The method as in claim 1, further comprising photolithographically patterning said second and third material layers and exposing a portion of said first material layer prior to said patterning.

4. The method as in claim 3, further comprising forming a fourth material layer between said first and second material layers and wherein said photolithographically patterning exposes said fourth material layer and further comprising further patterning to etch said fourth material layer and expose said first material layer.

5. The method as in claim 3, wherein said second material layer comprises photoresist and said third material layer comprises TARC (top anti-reflective coating).

6. The method as in claim 3, wherein said second material layer comprises a photoresist layer and said third material layer comprises a further photoresist layer.

7. The method of claim 1, wherein said first material layer comprises a dielectric.

8. The method as in claim 7, wherein said dielectric comprises one of an inorganic oxide, an organic oxide, a low-k dielectric, oxy-nitride, and nitride.

9. The method as in claim 1, wherein said lowermost bottom surface is substantially flat and forms the only bottom surface of said opening.

10. The method as in claim 1, wherein said etch selectivity of said first material layer to said third material layer is from about 0.5 to about 1.5.

11. The method as in claim 1, further comprising forming a further opening in a separate patterning operation that takes place after said patterning is concluded, said further opening extending downwardly from said lowermost bottom surface of said opening within said first material layer, to produce a dual damascene opening.

12. A method for forming an opening in a composite structure of material layers, comprising:
    forming a composite structure that does not include an etch stop layer by forming first, second and third material layers sequentially over a substrate, said first, second and third material layers having first, second and third thicknesses, respectively, said third material layer being an uppermost, exposed layer; and
    patterning to form an opening extending by a depth into said first material layer while removing a removed thickness of said third material layer using an etch process, a ratio of said depth to said removed thickness substantially corresponding to an etch selectivity of said first material layer to said third material layer in said etch process,
    said opening having a lowermost bottom surface consisting completely of said first material and said depth is predetermined based upon said removed thickness and said etch process is terminated based on said removed thickness and without use of an etch stop layer,
    wherein said removed thickness equals said third thickness, each of said first and second material layers comprise a photoresist and a detectable signal representative of a characteristic of said third material inflects when said third material layer is completely removed.

13. A method for forming an opening in a material layer, comprising:
    forming first, second and third material layers sequentially over a substrate, said first, second and third material layers having first, second and third thicknesses, respectively, and said third material layer being an uppermost, exposed layer; and
    patterning to form an opening extending by a depth into said first material layer while removing a removed thickness of said third material layer using an etch process, a ratio of said depth to said removed thickness substantially corresponding to an etch selectivity of said first material layer to said third material layer in said etch process, said opening having a lowermost bottom surface consisting completely of said first material, wherein said removed thickness is less than said third thickness and said patterning includes automatically terminating said etch process based upon said removed thickness and said ratio and without use of an etch stop layer when said depth equals a preselected depth.

* * * * *